United States Patent
Criado et al.

(10) Patent No.: US 10,589,857 B2
(45) Date of Patent: Mar. 17, 2020

(54) UNMANNED AERIAL VEHICLE

(71) Applicant: The Boeing Company, Chicago, IL (US)

(72) Inventors: Alfredo Criado, Barcelona (ES); Grzegorz M. Kawiecki, Madrid (ES); Omar Valero, Las Palmas (ES)

(73) Assignee: THE BOEING COMPANY, Chicago, IL (US)

(*) Notice: Subject to any disclaimer, the term of this patent is extended or adjusted under 35 U.S.C. 154(b) by 1196 days.

(21) Appl. No.: 14/608,014

(22) Filed: Jan. 28, 2015

(65) Prior Publication Data

US 2015/0210388 A1    Jul. 30, 2015

(30) Foreign Application Priority Data

Jan. 30, 2014  (EP) .................................. 14382029

(51) Int. Cl.
*B64C 39/02* (2006.01)
*G06K 9/00* (2006.01)
(Continued)

(52) U.S. Cl.
CPC ............ *B64C 39/024* (2013.01); *B64C 39/10* (2013.01); *G01R 31/58* (2020.01);
(Continued)

(58) Field of Classification Search
None
See application file for complete search history.

(56) References Cited

U.S. PATENT DOCUMENTS 3,161,374 A    12/1964   Allred et al.
7,159,817 B2   1/2007    VanderMey et al.
(Continued)

FOREIGN PATENT DOCUMENTS

EP        2660147 A1     11/2013
WO    2010070631 A1      6/2010

OTHER PUBLICATIONS

Office Action issued in Canadian Patent Application No. 2,872,028 dated Jan. 21, 2016.
(Continued)

*Primary Examiner* — John Olszewski
*Assistant Examiner* — Gerrad A Foster
(74) *Attorney, Agent, or Firm* — McDonnell Boehnen Hulbert & Berghoff LLP

(57) ABSTRACT

An unmanned aerial vehicle adapted for hover and short/vertical take-off and landing (S/VTOL) is disclosed. The vehicle comprises: a body having an aspect-ratio less than two and having therein a payload volume, at least one propeller located forward of the body, at least one rudder. The body may have an inverse Zimmerman planform which provides lift as air flows across the body in horizontal flight/fixed wing mode, and further adapted such that during hover and/or short/vertical take-off and landing (S/VTOL) the vehicle operates as a rotorcraft with the body oriented with the at least one propeller substantially above the body. The vehicle is suited to a method of inspection, such as power line inspection where large distances can be analysed efficiently by flying in fixed wing mode, but by transitioning to hover mode allows detailed inspection of selected areas.

19 Claims, 11 Drawing Sheets

(51) Int. Cl.
*H04N 7/18* (2006.01)
*B64C 39/10* (2006.01)
*G01R 31/58* (2020.01)

(52) U.S. Cl.
CPC ......... *G06K 9/00637* (2013.01); *H04N 7/185* (2013.01); *B64C 2201/028* (2013.01); *B64C 2201/042* (2013.01); *B64C 2201/104* (2013.01); *B64C 2201/108* (2013.01); *B64C 2201/123* (2013.01); *B64C 2201/127* (2013.01); *B64C 2201/141* (2013.01); *B64C 2201/165* (2013.01); *Y02T 50/12* (2013.01)

(56) References Cited

U.S. PATENT DOCUMENTS

| | | |
|---|---|---|
| 7,264,204 B1 | 9/2007 | Portmann |
| 7,410,122 B2 | 8/2008 | Robbins et al. |
| 7,543,780 B1 | 6/2009 | Marshall et al. |
| 7,909,308 B2 | 3/2011 | Lauder et al. |
| 8,172,177 B2 | 5/2012 | Lovell et al. |
| 2003/0025032 A1* | 2/2003 | Lepretre ................ B64C 27/20 244/7 B |
| 2006/0226280 A1 | 10/2006 | Alman |
| 2007/0200027 A1 | 8/2007 | Johnson |
| 2007/0215751 A1 | 9/2007 | Robbins et al. |
| 2008/0217486 A1 | 9/2008 | Colten et al. |
| 2010/0012776 A1 | 1/2010 | Hursig et al. |
| 2010/0140415 A1 | 6/2010 | Goossen |
| 2011/0031353 A1* | 2/2011 | Stolte ..................... B64C 21/04 244/207 |
| 2011/0248123 A1* | 10/2011 | Abershitz ............. B64C 39/024 244/4 R |
| 2012/0016538 A1 | 1/2012 | Waite et al. |
| 2012/0097801 A1* | 4/2012 | Barrett ................... B64C 27/24 244/7 A |
| 2012/0262708 A1* | 10/2012 | Connolly .............. B64C 39/024 356/237.2 |
| 2013/0175390 A1* | 7/2013 | Woodworth ........... B64D 27/26 244/54 |
| 2013/0306788 A1 | 11/2013 | Criado |
| 2014/0379179 A1* | 12/2014 | Goossen ................. G08G 5/02 701/18 |

OTHER PUBLICATIONS

European Search Report for European Patent Application No. 14382029.8 dated Aug. 18, 2014.

* cited by examiner

UNMANNED AERIAL VEHICLE

TECHNICAL FIELD

The present invention relates to an unmanned aerial vehicle (UAV) for inspection and surveillance. In particular, the unmanned aerial vehicle is adapted for mixed use at low speed and high endurance.

BACKGROUND ART

Endurance, runway-dependency and the need for additional infrastructure for take-off and landing are among the most important characteristics of UAVs. Conventionally unmanned aerial vehicles can be divided into three classes, namely: i) high-endurance, runway-dependent aircraft, such as, e.g. Global Hawk; ii) high-endurance runway independent aircraft that need additional infrastructure for take-off and landing, such as, e.g. Boeing Scan Eagle; and iii) low endurance, runway independent aircraft that do not need any additional infrastructure for take-off and landing because of the capability to hover, such as any rotary wing aircraft, e.g. Boeing Unmanned Little Bird.

Typically, rotary wing aircraft have far lower aerodynamic efficiency and, therefore, range and endurance, than fixed wing aircraft. Lower aerodynamic efficiency is detrimental also to such parameters as speed and payload.

One use of UAVs is the inspection of power lines which stretch many hundreds of kilometres. Recently helicopter based UAVs have been used for power line inspection as fixed wing based UAVs do not have the capability to fly slow enough to perform detailed spot inspection, such as for hot-spots. Fixed wing UAVs also require infrastructure, such as runways, for take-off and landing. However, the helicopter based UAVs have far inferior endurance and range, as compared with fixed wing aircraft. This is due to an inherently lower efficiency of a rotor in forward flight, as compared with a fixed wing.

Hence, there is a need for high-endurance UAVs that can cover large distances while also able to hover and perform short/vertical take offs and landings. Such a UAV would also allow larger sections of power line to be inspected from a single launch site.

SUMMARY OF THE INVENTION

The present invention provides a long range unmanned aerial vehicle adapted for hover and short/vertical take-off and landing (S/VTOL), the vehicle comprising: a body having an aspect-ratio less than two, the body comprising therein a payload volume; two propellers, at least one located forward of the body; at least one rudder and two flaps located toward the rear of the body, wherein the body is adapted to provide lift as air flows across the body, and further adapted such that during hover and/or short/vertical take-off and landing (S/VTOL) the vehicle operates as a rotorcraft with the body oriented with the at least one forward mounted propeller substantially above the body. Although two propellers are preferable, an alternative embodiment may use a single propeller located forward of the body. By the term UAV we mean an unmanned aerial vehicle that is capable of flying autonomously controlled by a computer or microprocessor on board.

Aspect ratio is the aspect ratio of the wing or lift structure, which in this case is the body. Simplistically the aspect ratio is the ratio of the body's length to breadth or chord length. For more complex shaped bodies, such as those for which the chord length varies along the length of the wing or lift surface, the aspect ratio is (wingspan)$^2$ divided by wing area. The number of propellers is preferably at least two so as to provide stability and prevent rotation of the body. For a single propeller embodiment a stabilizing torque will be needed to prevent rotation of the body. This may be provided by differentially deflected ailevators, particularly if they are blown with exhaust such as fuel cell exhaust.

The advantage of the unmanned aerial vehicle is that it can operate in fixed wing mode to cover significantly larger distances and/or have significantly higher endurance than a helicopter with equivalent payload capacity. Furthermore, when a target zone or hot spot is identified it can transition to hover mode in which the vehicle has the advantages of a rotorcraft, namely low speed and close inspection.

During short/vertical take-off and landing the body may be oriented such that the vehicle operates in part as a rotorcraft and in part as a fixed wing air vehicle. During hover the vehicle operates as a simplified rotorcraft. If the propellers are based on conventional UAV propellers they will not have cyclic control typical for helicopter rotors and, therefore, the UAV rotors will primarily control vertical movement but have little control of sideways movement. In a further embodiment, the propellers may be provided with cyclic control, for example, using proprotors, so as to provide sideways control of movement.

During a short take-off configuration the lifting force will be provided by a sum of the vertical component of propellers' thrust and the vertical component of the lifting force developed on the body due to forward motion. The steeper the take-off/landing angle, the smaller the contribution of the lifting force component developed at the body.

During horizontal flight the body may be oriented substantially horizontally, with the propeller located forward of the body. During hover the body is oriented substantially vertically, with the propeller located at least partly or substantially above the body. A low or close to zero angle of attack may be considered to be horizontal, whereas a near 90° angle of attack may be considered as vertical.

The body may have a Zimmerman planform, an inverse Zimmerman planform, a square or rectangular planform, or a circular or elliptical planform.

The body may be a blended fuselage-wing such as an all-lifting body.

The unmanned aerial vehicle may comprise two flaps extending laterally from the rear of the body and two propellers located forward of the body. These direction references are preferably taken with the body horizontal.

The at least one propeller may be mounted on a pod extending forward from the body. Preferably, the propellers have electric motor drive. This reduces noise and vibrations compared to internal combustion engines.

The unmanned aerial vehicle may comprise a controller configured to operate the, preferably, two propellers for differential thrust and torque during horizontal and/or vertical maneuvers. The differential thrust/torque may be achieved either by changing propeller blades' pitch (the equivalent of collective in helicopter rotors) or by changing the relative rotational velocity of the motors driving the propellers. It is possible to generate differential torque which could rotate the body with respect to the longitudinal axis, while maintaining equal thrust to prevent rotation with respect to the lateral axis. This may be achieved by running one of the rotors with blades at high pitch (high torque) but low rotational velocity (low thrust) while the other rotor runs at very low pitch but high rotational velocity. The vehicle preferably has a thrust to weight ratio greater than one, so as to achieve hover.

The unmanned aerial vehicle may further comprise: at least one electric motor to drive the at least one propeller; a fuel cell for generating electricity to power the at least one electric motor; and an exhaust conduit for guiding the fuel cell exhaust to blow across the flaps. Although in some embodiments a single electric motor may drive more than one propeller, it is preferable that each propeller is driven by a corresponding electric motor.

The fuel cell may be located in the front of the body and in front of the hydrogen tank for powering the fuel cell. The exhaust conduit may be arranged to guide the exhaust gas past the hydrogen tank and to the rear of the body, or wherever the flaps are located.

The unmanned aerial vehicle may further comprise: a camera located to the rear of the body; an image processor coupled to the camera; and a guidance system, wherein during short/vertical landing the orientation of the body directs the camera downwards, the image processor receives data from the camera and identifies a landing site, and the image processor communicates with the guidance system to guide the unmanned aerial vehicle to the landing site. In other words, by transitioning to landing mode, the body is reoriented which in itself directs the camera toward the ground.

The unmanned aerial vehicle may further comprise lower body skin skids for rolling landings.

The present invention further provides an inspection apparatus comprising the unmanned aerial vehicle set out above, and further comprising an imaging device mounted to the vehicle. In exemplary embodiments, the unmanned aerial vehicle or apparatus may be used for inspection of power lines; inspection or surveillance or terrain, forestry, roadways, and/or livestock; or applications in which mixed use at low speed and high endurance is required.

The present invention provides an inspection method, comprising: flying an unmanned aerial vehicle in fixed wing mode in the vicinity of an area or structure to be inspected; collecting image or sensor data of the area or structure with a camera or sensor of the unmanned aerial vehicle; and upon detection of a target zone instructing the unmanned aerial vehicle to hover causing the unmanned aerial vehicle to change orientation and operate as a rotorcraft.

The target zone may be selected based on the collected image or sensor data of the area or structure, said target zone may be part of the area or structure. The target zone may be inspected using higher resolution, greater magnification, or alternative sensors to those used in fixed wing mode.

The change in orientation may direct a camera or sensor at the target zone, such as up or down at the target zone.

The unmanned aerial vehicle used in the method may be the unmanned aerial vehicle set out above.

The method is particularly suited to power line inspection. Hence, the present invention provides a method of power line inspection, comprising the method above, wherein the structure to be inspected is a power line and the target zone includes a fault or impending fault. The power line may be a tower or pylon mounted high voltage electricity cable or network. By changing the camera positions it is also possible to inspect ground based infrastructure such as gas or oil pipelines, or road and rail networks.

BRIEF DESCRIPTION OF THE DRAWINGS

Embodiments of the present invention, along with aspects of the prior art, will now be described with reference to the accompanying drawings, of which.

DETAILED DESCRIPTION

Figure 2A:
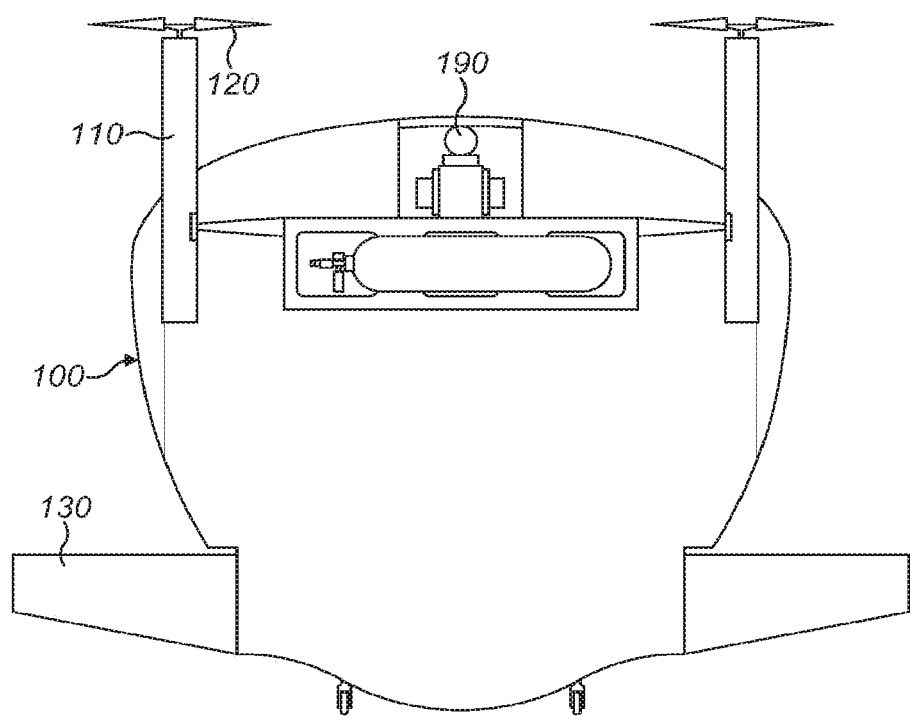
FIGS. 2a-2c are respectively top, front and side views of a unmanned aerial vehicle according to the present invention.
Figure 2B:
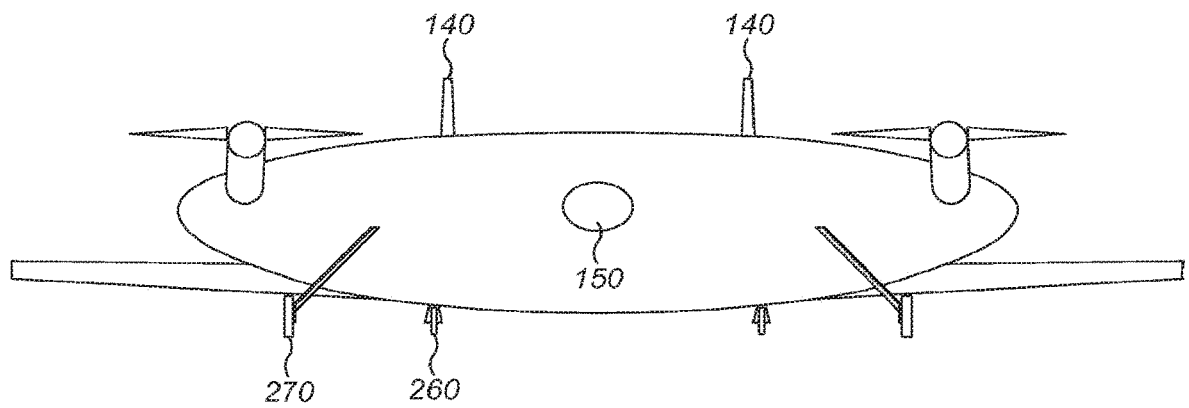
Figure 2C:
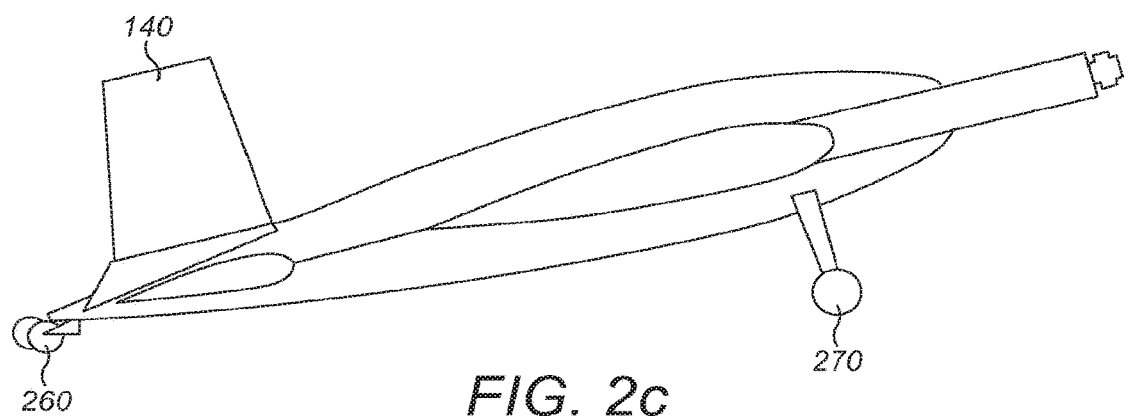

FIGS. 2a-2c show a low aspect-ratio unmanned air vehicle with vertical take-off and landing capability, hover capability, high cruising speeds and long range. The air vehicle comprises a body 100 having surfaces that provide lift, that is the air vehicle has a blended fuselage-wing configuration, but unlike other blended fuselage wing configurations most if not all of the whole of the body can be considered to be both wing (lifting surface) and fuselage (payload accommodation). FIG. 2a is view of the air vehicle from above. The vehicle planform is a disc-like shape. Possible planforms include rectangular, square, ellipse, circular, Zimmerman, inverse Zimmerman. The FIG. 2 embodiment shows a Zimmerman, or more precisely an inverse Zimmerman planform. The Zimmerman planforms have a shape formed by the intersection of two ellipses, for example, in which a first ellipse is cut by a second elliptic curve. The remaining part of the first ellipse forms the major part (greater than half, such as three quarters) of the planform perimeter, and the second elliptic curve forms the minor part (less than half, such as a quarter) of the planform perimeter. Inverse Zimmerman and Zimmerman planforms have the same shape but the leading edges are different. For the inverse Zimmerman planform, the leading edge is formed by the second elliptic curve/minor part, whereas for the Zimmerman planform that forms the trailing edge.

As shown in FIG. 2a in front of the body are a pair of propellers 120. These are mounted at the front end of pods 110 extending forwards from the front of the leading edge of the body 100 and close to the lateral extremes of the body. At the rear of the body are located a pair of flaps or ailevators 130. Similar to the propellers these are mounted towards the lateral extremes of the body. The ailevators extend laterally outwards from the edge of the body.

FIGS. 2b and 2c respectively show front and side views of the vehicle. These figures show that the undercarriage orients the nose of the air vehicle in most cases at an angle of 10-45° upwards from the horizontal. Two rudders 140 are located at the rear of the vehicle to the upper side of the body. Both rudders 140 can be seen in FIG. 2b. One can be seen in FIG. 2c.

FIG. 2a shows the area of the wing planform and its low aspect-ratio can be clearly seen. Aspect-ratio AR is defined by:

$$AR=b^2/s$$

where b is the wingspan and s is the area of the wing planform. The vehicle shown in FIGS. 2a-2c has an aspect ratio in the range 0.5 to 2.0.

Figure 1A:
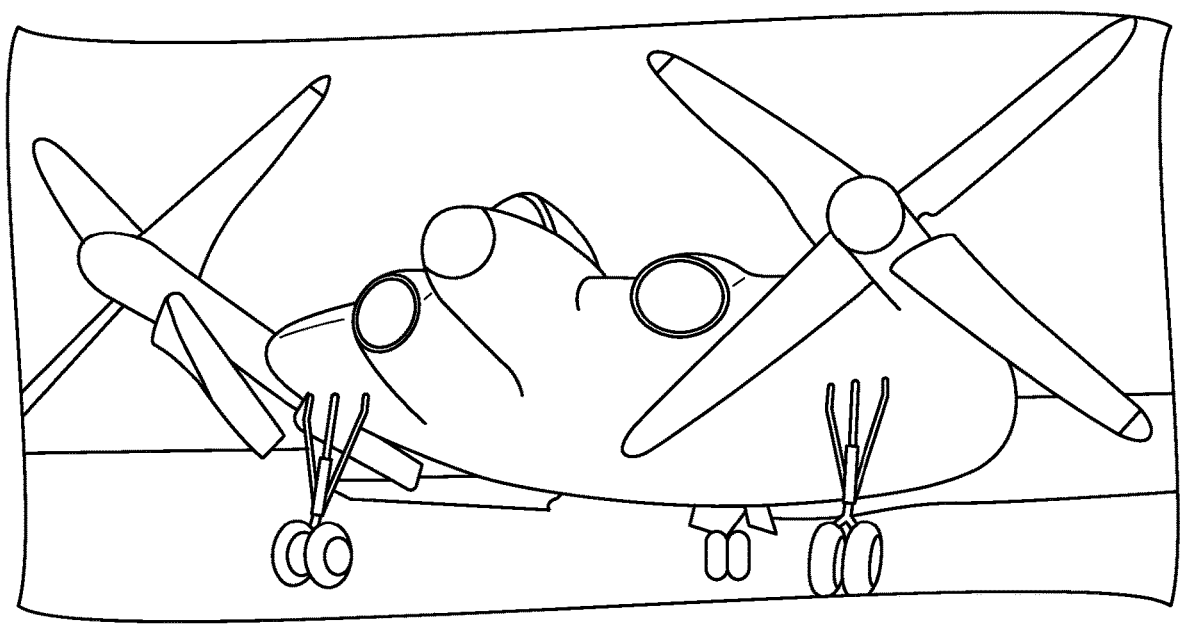
FIGS. 1a-1c are photographs of the prior art Chance-Vought XF5U "flying pancake", as a full-scale test aircraft (FIG. 1a) and as a wind-tunnel scale model (FIGS. 1b and 1c)
Figure 1B:
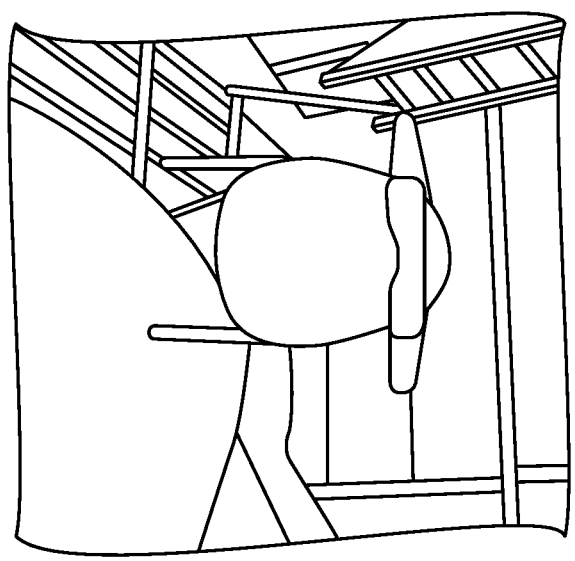
Figure 1C:
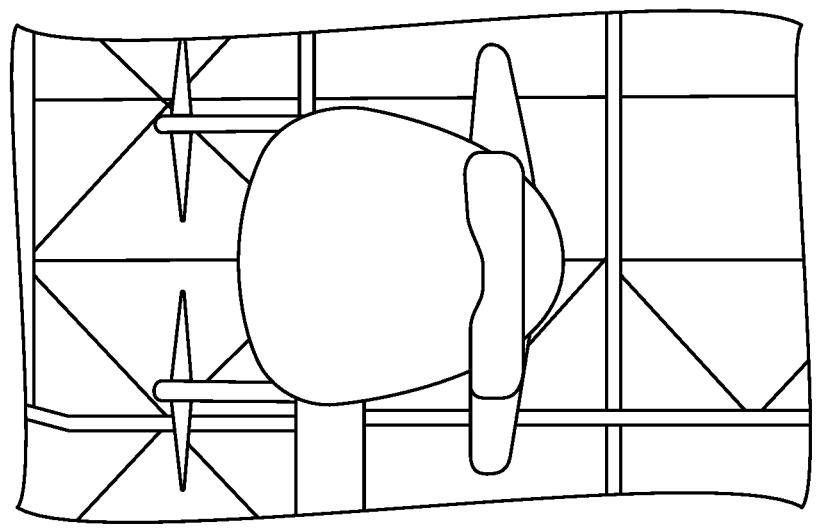

The planform of the unmanned air vehicle of FIGS. 2a-2c is derived from the Chance-Vought XF5U which was under development as a full scale fighter aircraft in the 1930s and 1940s. The Chance-Vought XF5U is shown in the photograph of FIG. 1a. Wind tunnel testing of a scale model of the XF5U is shown in the photographs of FIGS. 1b and 1c.

A largely disc-shaped planform would generally be thought to have very poor performance because of the small wing span. Furthermore, high pressure air below the wings could easily move around the end of the wing tip creating vortices above the wing. This causes drag and reduces lift. However, the propellers rotate in the opposite directions to the vortices counteracting their effect such that lift is maintained and drag is reduced. The vortices on the port and starboard sides of wing rotate in opposite directions, consequently the propellers rotate in opposite directions to counteract vortices at both sides of the wing.

The unmanned air vehicle of FIG. 2 has a large payload volume capable of housing electric motors and a hybrid battery-fuel cell power system. A variety of cameras and sensors can also be mounted in the payload.

Figure 8:
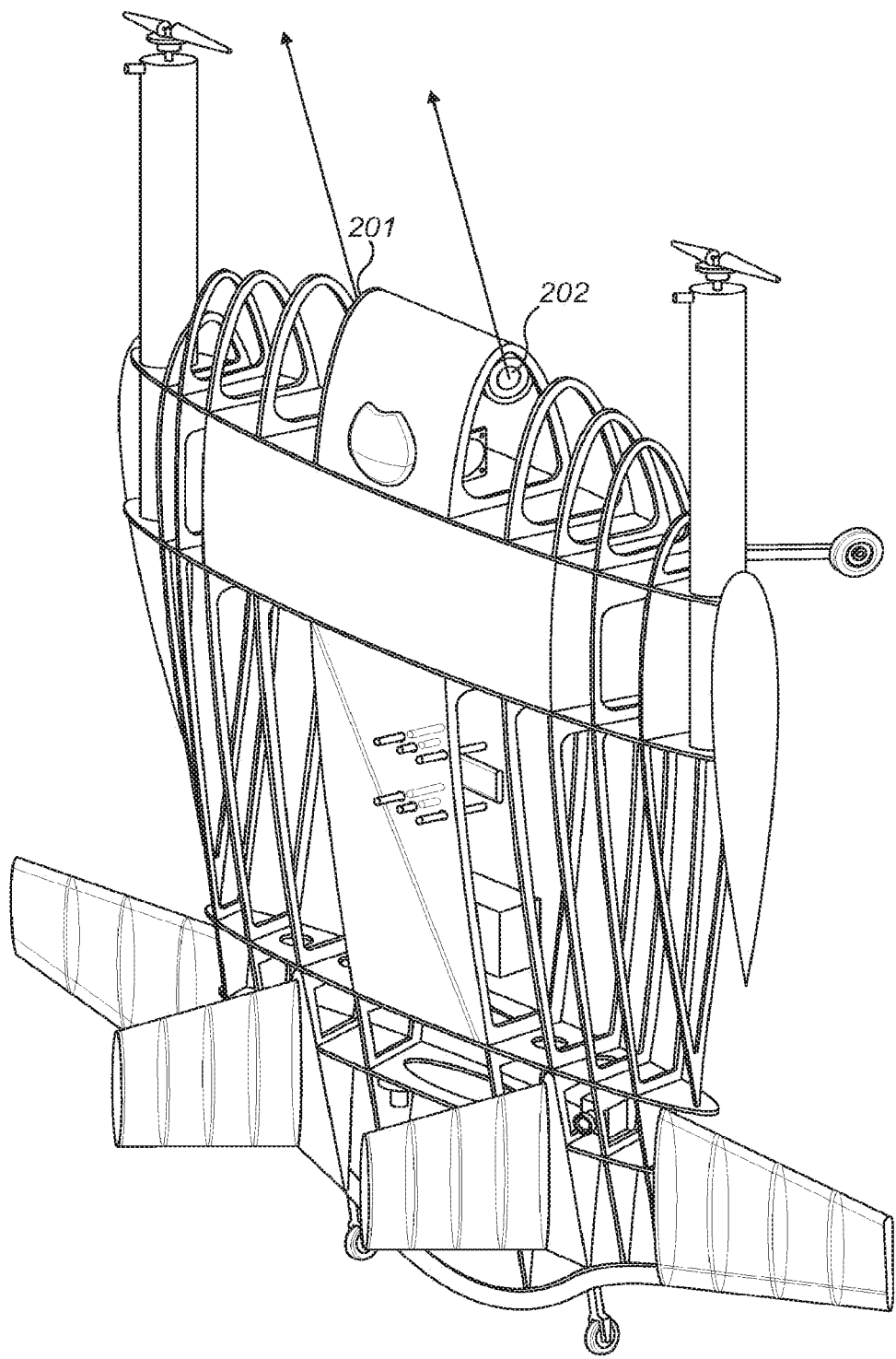
FIG. 8 is a view of the unmanned aerial vehicle of the present invention in hover mode, with skin partially cut away to expose cameras.

In horizontal flight lift is provided by the surfaces of the body, with forward propulsion being by the propellers. When the speed of the unmanned air vehicle is reduced, the orientation of the body changes, such that when the unmanned air vehicle is hovering the body is arranged vertically as shown in FIG. 8. Hence, when hovering the vehicle operates as a rotorcraft with the propellers acting as rotors above the body. As discussed above, for two propellers they rotate in opposite directions so there is no net moment on the body to cause it to rotate. Conveniently this arrangement avoids the need for a tail rotor as found on conventional helicopter systems to prevent rotation of the body.

As shown in FIGS. 2a and 2c, the propellers are mounted significantly in front of (or above, when in hover mode) the body, for example at least the length of the propeller blades in front of the body. This configuration reduces interferences between propeller blades and the body on propeller start-up.

The propellers are preferably folding propellers such that they can be folded down against the body to provide compactness during transit of the unmanned air vehicle to a launch site.

Figure 7A:
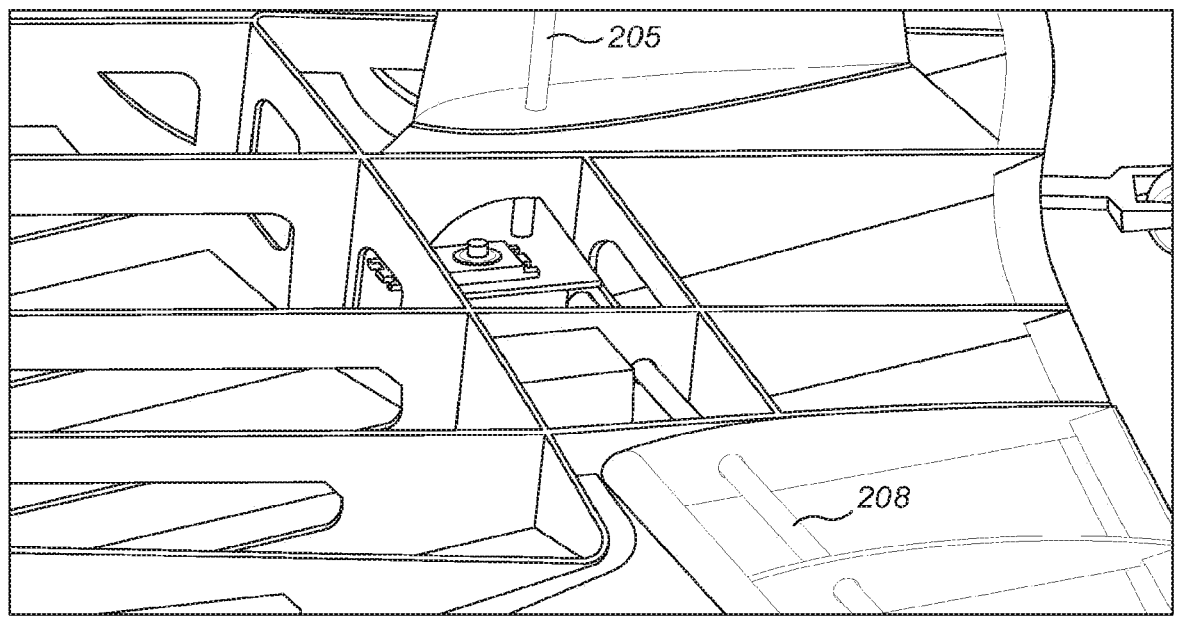
FIGS. 7a and 7b are views of the tail and ailevators, with skin cut away to show interior.
Figure 7B:
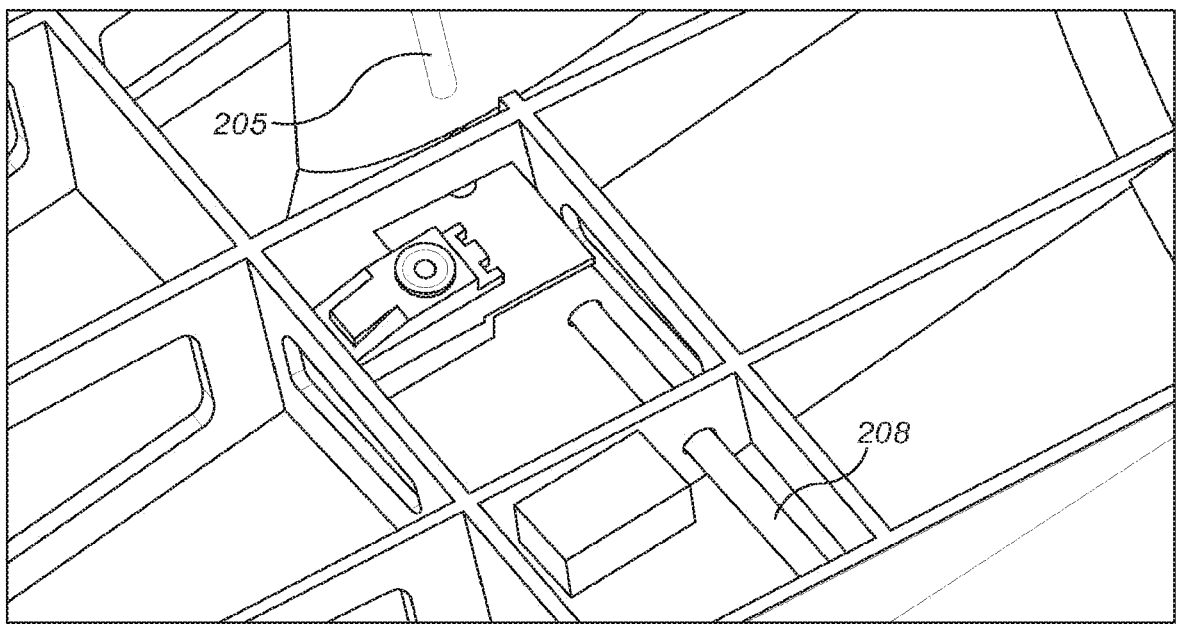

As shown in FIGS. 2a-2c the unmanned air vehicle preferably has two large rudders and two large ailevators to provide control during hover, horizontal flight and take-off and landing. The rudders 140 are built around a spar 205 extending through the rudder. The spar in each rudder is driven by a servo motor for rotation. The spar provides both structural rigidity and rotation drive to the rudder without requiring separate structures for each. The spar 205 of the rudders is shown in FIGS. 7a and 7b. In the preferred embodiment the rudder forms the whole of the vertical tail surface, and there is no fixed surface. The whole of the rudder rotates. In alternative arrangements, a single rudder and two ailevators may be used, or more than two rudders and ailevators.

The ailevators 130 shown in FIGS. 2a and 2b form the widest extremes of the air vehicle. They extend laterally from the edges of the body. The ailevators are configured to rotate. Together the two ailevators have a length comparable to the width of the body. The rudders 140 may have a height similar to the length of the ailevators. Similarly to the rudders 140, the ailevators have structural rigidity provided by spars 208 which are also arranged for rotational drive. The spars 208 of the ailevators are shown in FIGS. 7a and 7b.

In a preferred embodiment the propellers are driven by electric motors, with electricity generated by an on-board hybrid battery-fuel cell system.

A shown in FIGS. 2a and 2b, a primary camera or sensor 190 may be mounted at the front of the unmanned air vehicle for use during horizontal flight. The camera may collect imaging information during flight and may be gimbal mounted to maintain horizontal alignment as flight trajectory changes. The camera may also be mounted for driven rotation to direct the camera towards an area to be viewed. The camera may be a video camera operating in the visible spectrum, or may use other wavelengths of the electromagnetic spectrum. For example, the camera may be an imaging sensor operating in the infra-red to collect temperature information.

Figure 4A:
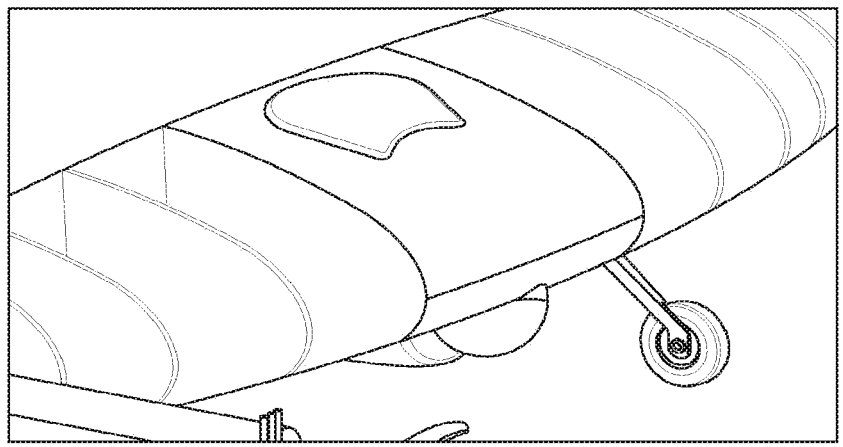
FIGS. 4a, 4b and 4c are all view of the front of the unmanned aerial vehicle according to the present invention, including top and underside views of the fuel cell and camera.
Figure 4B:
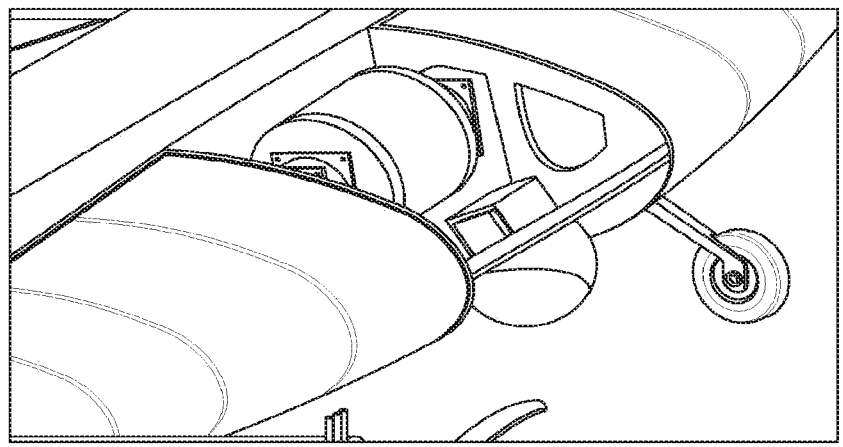
Figure 4C:
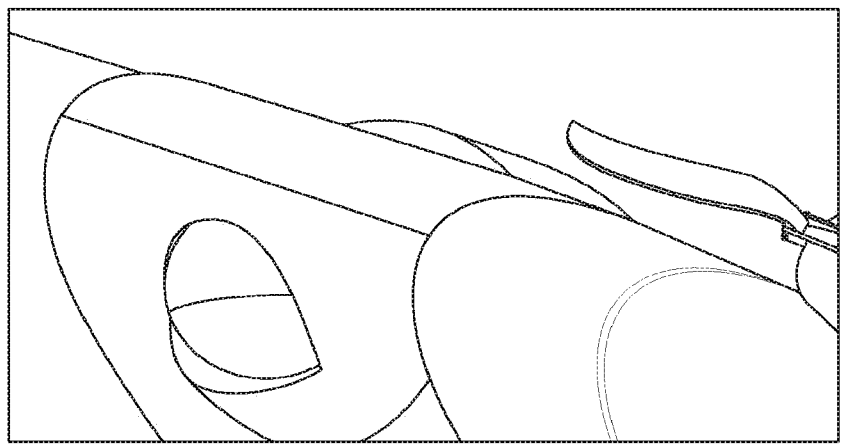

The camera or imaging sensor 190 may be mounted towards the front of the unmanned air vehicle. As shown in FIG. 2b and FIG. 4 the camera 190 may operate from the underside of the body. Alternatively the camera may be mounted for operation from the upper-side of the body. In both cases the field of view is limited by the position of the body. As discussed above, when the unmanned air vehicle operates in hover mode the body 100 is oriented vertically which changes the field of view of the camera. Furthermore, while it is useful to have a camera mounted for movement on the air vehicle, this camera may not have the resolution or may not operate in the desired part of the electromagnetic spectrum. Hence, it is desirable to provide alternative cameras arranged for operation when the body is oriented vertically during hover. Furthermore, these additional cameras may provide higher resolution or operate at a wavelengths more suited to the application.

In the exemplary embodiment for power line inspection, the unmanned air vehicle is equipped with a high definition camera 201 operating in the visible part of the spectrum and an infra-red camera 202. The infra-red camera 202 is adapted for monitoring faults in the power line. Such faults often exhibit a high temperature region as a result of a break, fracture or other resistive defect in the conductor in which heat is generated resulting in a "hot-spot". The type of infra-red camera may be selected that has sensors adapted for operation at wavelength appropriate for such "hot-spot" monitoring.

Figure 9:
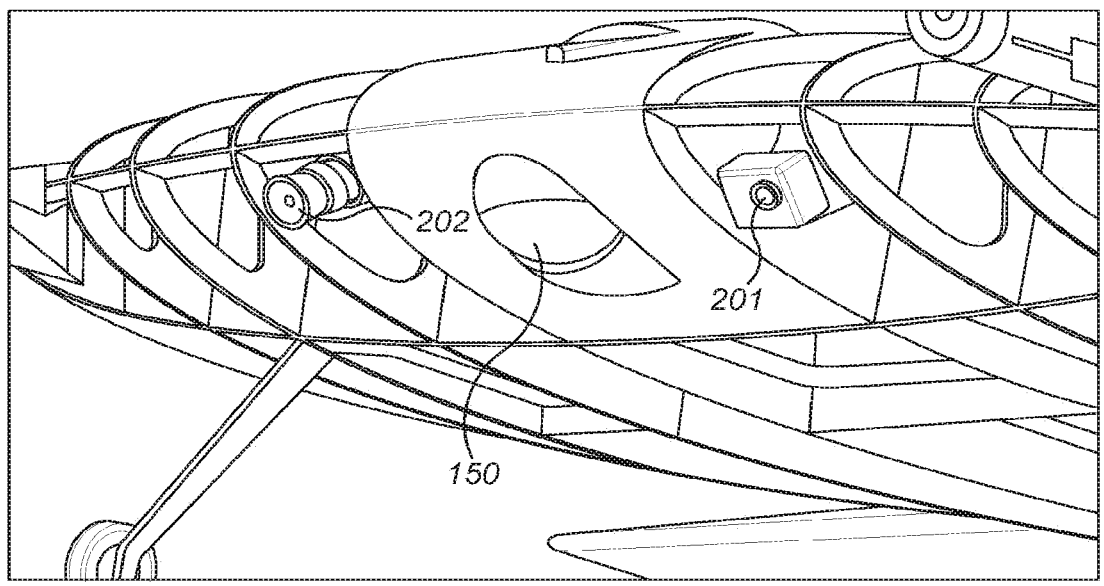
FIG. 9 is a view of the unmanned aerial vehicle of the present invention, showing front pointing cameras.

The two additional cameras 201 and 202 are shown in FIGS. 8 and 9. These cameras are mounted either side of the main camera 190 towards the front of the air vehicle. However, the cameras 201 and 202 are mounted closer to the leading edge than the camera 190, and again may be mounted above or below. Preferably, they are mounted close enough to the leading edge that the leading edge does not obscure the field of view of the cameras.

Figure 11:
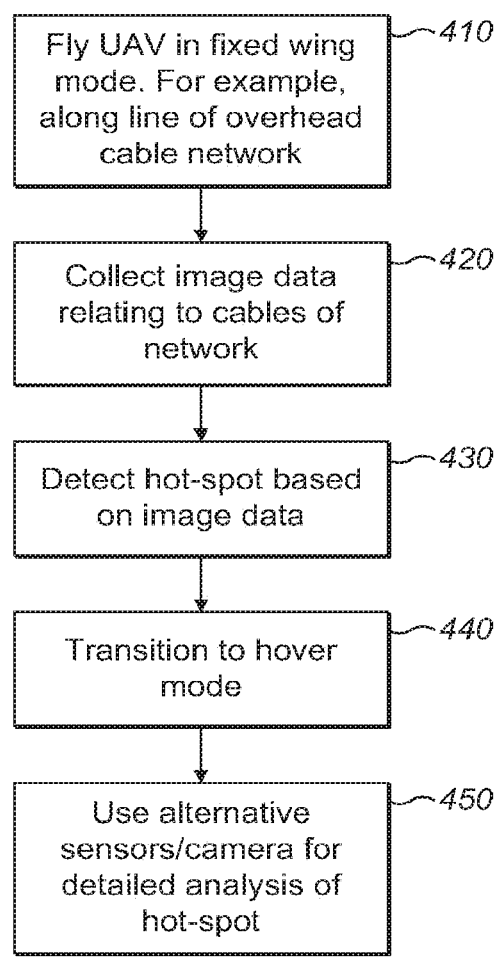
FIG. 11 is a flow chart identifying steps according to a method of the present invention.

FIG. 11 is a flow chart setting out steps of a method of inspection. In operation, for example, inspecting power lines such as high voltage overhead power lines, the unmanned aircraft flies or cruises horizontally 410 and uses the main camera 190 which might be a video camera to inspect the power lines 420. In this mode the air vehicle would be oriented horizontally. Whenever a hot-spot is detected 430 during cruise, the air vehicle would reduce its horizontal speed and transition to a hover mode 440 in which the body is oriented vertically, or close to vertical. The cameras or sensors 201 and 202 point upwards and, optionally, slightly forwards of the body towards the "hot-spot". The position of the aircraft 450 sets the direction of viewing of the cameras 201 and 202 without the need for gyroscopes or complex and heavy positioning actuators. The aircraft is flown in the vicinity of electrical towers or pylons. In particular, the aircraft may be flown below and to the side of the towers. Conventional UAVs performing the power line inspection task have a camera mounted on the underside of the vehicle. This necessitates flying the UAV above the power lines and electrical towers which could put at risk manned aircraft flying over the power lines and towers. The unmanned air vehicle described herein avoids the need to fly over the power lines and towers by being able to hover and by having the camera at the upper side of the vehicle during hover operations, and/or by having the camera pointing upwards during hover operations.

Figure 6:
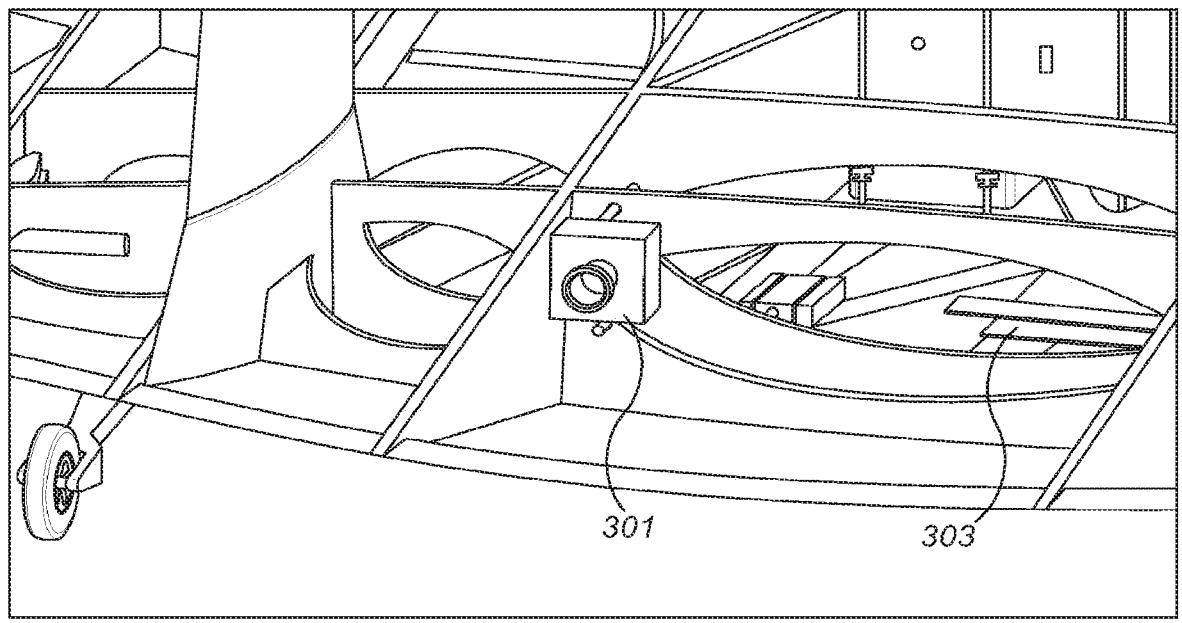
FIG. 6 is a view of the tail of the unmanned aerial vehicle of the present invention, with skin cut away to show interior.

A further camera 301 may be provided at the tail of the body as shown in FIG. 6. The tail camera 301 may be used for imaging landing sites during vertical landings. In such landings the aircraft would likely have reduced its horizontal speed and transitioned to hover before landing. As discussed above, during hover the body of the vehicle is oriented vertically such that tail camera 301 points downwards. The tail camera images the ground for possible landing sites or generally images a landing area. The image data could be sent to a remote operator. Alternatively, the image data is sent to an on-board image processor 303 that uses pattern recognition to detect a known pattern identifying a landing site.

Figure 5:
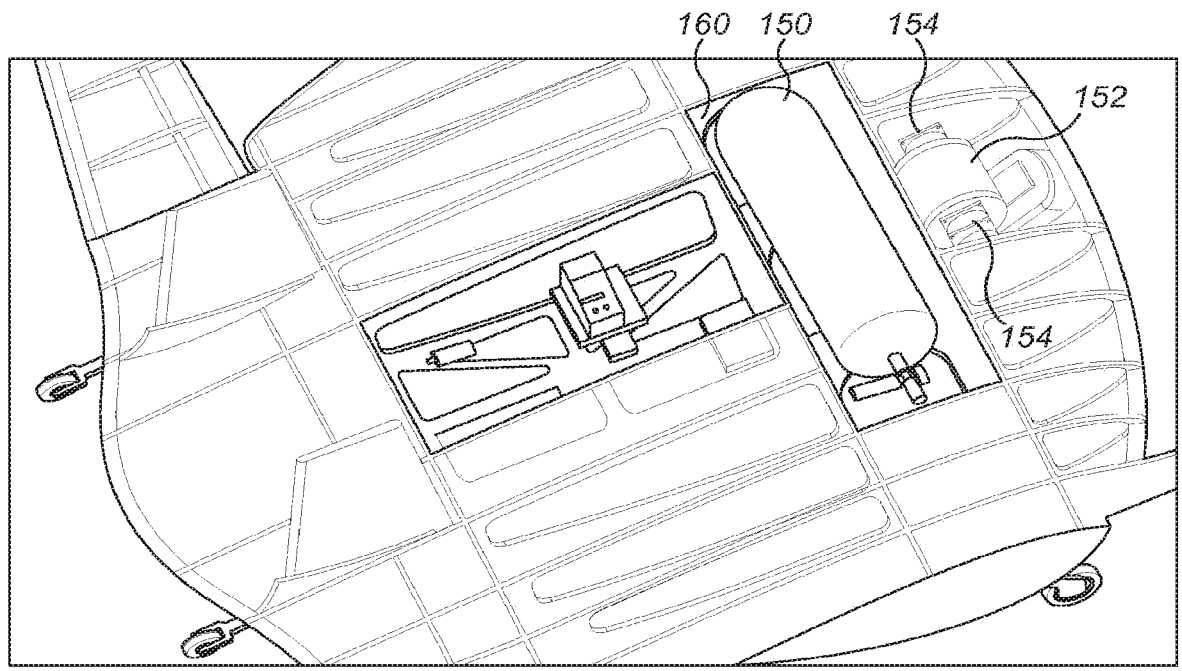
FIG. 5 is a top view of the unmanned aerial vehicle according to the present invention showing the layout of internal components and systems.

Preferably, the unmanned aerial vehicle is powered by electric motors from electricity supplied from an on-board hybrid battery-fuel cell system. The fuel cell part of the system produces electricity from hydrogen supplied from an on-board fuel tank and oxygen extracted from the atmosphere. The fuel cell system may comprise a cell stack comprising many cells stacked together to provide the required voltage and/or power. The fuel cell system is air-cooled by fans operating on the fuel cell or stack. The heated exhaust gases are warmer than the surrounding air and can be used to provide lift. In FIG. 5 fuel cells or a fuel cell stack 152 can be seen towards the front of the vehicle. Behind the fuel cell stack 152 is a fuel tank 150 containing hydrogen. The fuel cell or stack is cylindrical. At each end of the cylinder is a fan 154 for forcing air through the stack to cool the fuel cell.

Figure 10:
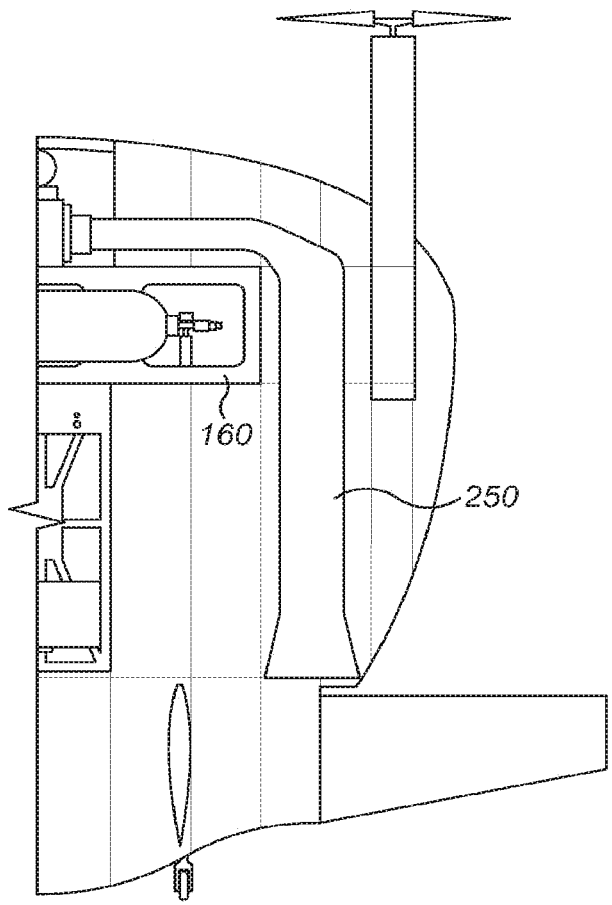
FIG. 10 is a schematic view showing the conduit routing for guiding fuel cell exhaust gasses to blow over the rear flaps of the unmanned aerial vehicle of the present invention.

The heated exhaust air is used to provide lift by blowing over a lift surface. FIG. 10 shows a conduit 250 for guiding the exhaust air to the rear of the air vehicle such that at least some of the exhaust is blown over the upper surface of the flaps or ailevators. The fuel tank is generally much larger than the fuel cell or fuel cell stack so that the conduit 250 is arranged to guide the exhaust from the fuel cell, to the side of the fuel tank, and to the rear of the vehicle such that it leaves the vehicle over the ailevators. This arrangement is similar to the described in European Patent Application No. 12382165.4 by the same applicant. The blowing of the flaps or ailevators in this manner can also be used to correct any unsteady flight behaviour such as found in the XF5U. FIG. 10 shows a single conduit guiding the exhaust from one side of the fuel cell (right hand side when viewed from above) to the ailevator on the same side of the air vehicle. A corresponding second conduit is arranged on the other side (left hand side) of the fuel cell to blow the ailevator on that side of the vehicle. In other arrangements a single conduit may be provided centrally along the aircraft and dividing at the rear to blow the ailevators.

As mentioned above the air vehicle is provided with wheels and undercarriage or landing gear which orients the body, in most cases, at 10-45° to the ground. As shown in FIG. 2b the undercarriage comprises four wheels. The first wheels 260 are rotationally coupled to mounts extending from the rear of the body. There are two wheels 260. The two wheels 260 and mounts are laterally spaced along the rear edge of the body by approximately the same spacing as the rudders 140. This first pair of wheels provides ground clearance for the rear of the body. The second wheels 270 are provided extending from mounts towards the front of the body 100. There are two wheels 270. The mounts for these two wheels are taller than those at the rear and extend at an angle diagonally sideways. The greater height of the mounts for the front wheels provides the, in most cases, 10-45° orientation to the body when on the ground.

The undercarriage and wheels may be retractable into the body after take-off.

The unmanned air vehicle may be provided with skids on the underside of the body for skid landings without the need for undercarriage. By skid landings we mean landings in which the vehicle has horizontal velocity and so is not performing a vertical landing. The skids may form part of the skin of the body, such as for belly landings. Unmanned air vehicles without undercarriage or wheels have the advantage of reduced weight and drag penalties. Take-off may still require undercarriage to provide efficient forward movement, but the undercarriage may be ejected or released shortly after take-off. The aircraft may rest on an undercarriage dolly that is left on the ground after a sufficient lifting force is developed during a short take-off run.

As set out above there are numerous differences between the present invention and the prior art XF5U. In addition, the original XF5U was proposed as a manned fighter aircraft. The present invention has removed the pilot canopy, as it is not required. The smoothed airflow over the upper surface of the body increases the stability in flight. Furthermore, the motor inlets shown at the front of the XF5U, between the propellers and the pilot canopy have also been removed. The removal of these features also acts to prevent boundary layer separation. Again this further stabilizes the aircraft during flight.

In an embodiment of the present invention, the unmanned air vehicle had been developed and is particularly suited to monitoring and inspection activities. In one exemplary embodiment the monitoring and inspection activity may be power line inspection, for example electrical power lines carried overhead by towers, masts or pylons. In other embodiments the unmanned air vehicle could be adapted to monitor ground placed power lines. For example, electrical cable, or gas or other fuel pipelines. The unmanned air vehicle may also be used for monitoring critical infrastructure such as roads and railways. The flexibility to monitor different targets arises from the large payload bay size which provides space for a variety of camera and sensor to be mounted. This combined with high endurance makes the unmanned air vehicle flexible enough to be able to fly large distances and then hover to provide detailed monitoring a selected area or target.

The unmanned air vehicle enables short/vertical take-off and landing (S/VTOL) capabilities in a long endurance 10 kg class UAV. The expected endurance is five hours, with a speed range of between 45 and 100 km/h in horizontal flight. In hover the endurance is 2.5 hours. The vehicle is modular and has a take-off weight of between 9 and 13 kg depending on specification for payloads between 400 and 800 g. The lighter versions have extended endurance up to 6.5 hours.

Compared to a prior art unmanned air vehicles, the unmanned air vehicle outperforms them. The following table provides a comparison, using as an example a 2.5 hour endurance vehicle with the ability to carry a 0.5 kg payload.

TABLE 1 comparison of prior art UAVs and the present invention.

| | Payload | Endurance | Max speed/range | Hover/VTOL |
|---|---|---|---|---|
| Electric Helicopter UAV | 0.5 Kg | ½ hour | Max | Yes |
| Electric mini-UAV fixed wing | 0.5 Kg | 1 h to 1 h 15 min | 40-120 km/h | No |
| VTOL platform | 0.5 Kg | 45 mins | Max 46 km/h | Yes |
| UAV of present invention | 0.5 Kg | 2 and a ½ hours | 45-100 km/h | Yes |

As can be seen in the table, the present invention has the advantages of both VTOL and fixed wing air vehicles. VTOL operations are usually provided by helicopters but as shown above these lack adequate endurance and flight speeds.

Conversely, conventional fixed wing mini UAVs have too fast speed ranges that do not allow detailed spot inspection, and also required infrastructure for launch. The long endurance of the present invention allows single launch inspection of power lines over distances >100 km.

The use of electrical power systems results in quiet operations which for power line monitoring in urban or built up locations provide less disturbance to persons in the surrounding area. The quiet operations would also enable close and quiet support to military operations.

Figure 3:
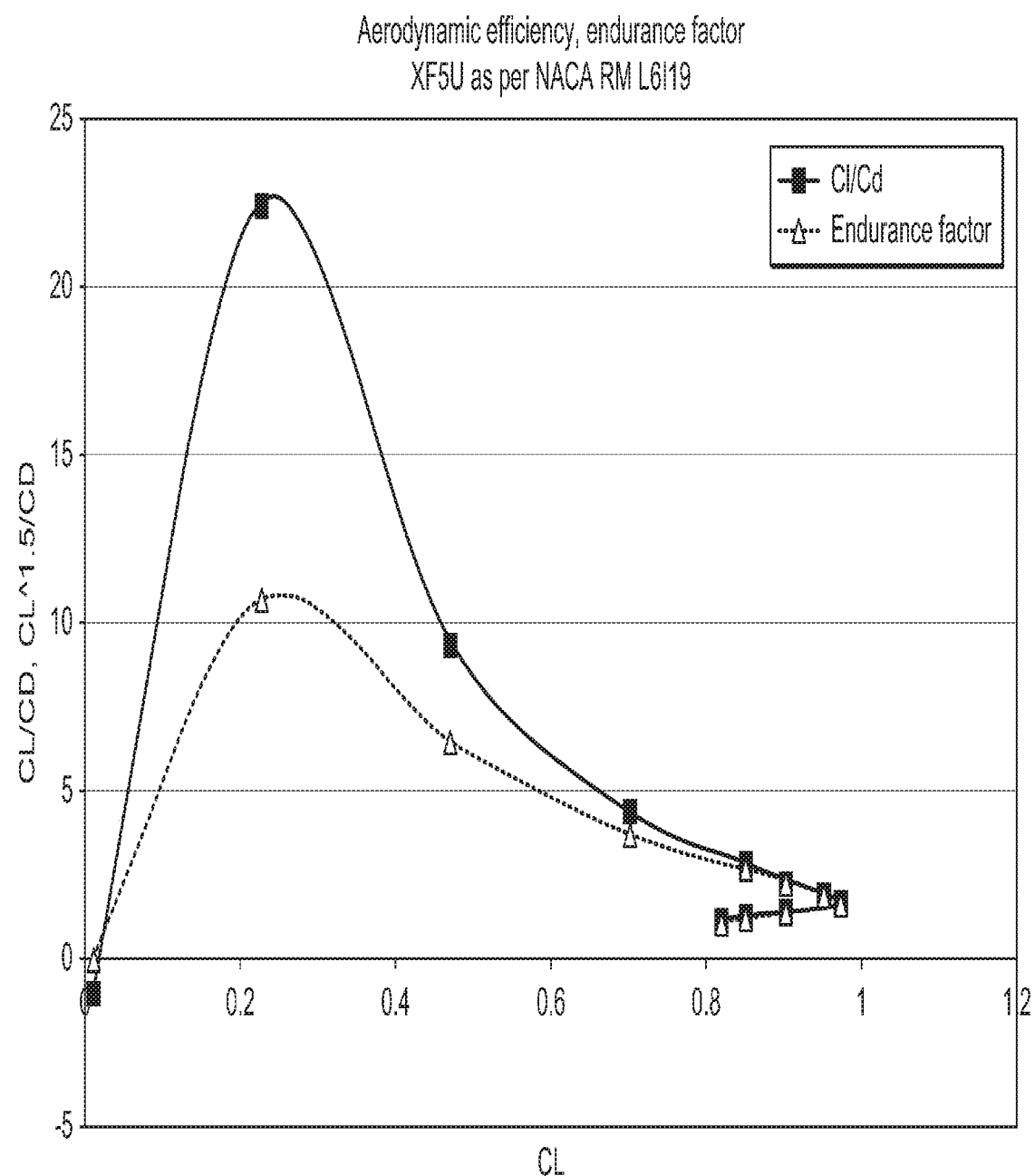
FIG. 3 is a graph showing the aerodynamic efficiency and endurance factor of the Chance-Vought XF5U.

The external and some of the internal configuration of the air vehicle is shown in FIG. 2. The air vehicle includes a 500 W cruise or 800 W peak power hybrid fuel cell system, which includes a lithium polymer (Li—Po) battery to deliver additional power during the take-off phase. Previous wind tunnel testing relating to the prior art work on Zimmerman designs such as the XF5U provided aerodynamic data. This data in combination with the power available led to a 1.3 m span size initially being chosen. FIG. 3 shows efficiency curves for this configuration. Along the abscissa is shown the lift coefficient, CL. Along the ordinate are two parameters, CL/CD and $CL^{3/2}/CD$, where CD is the drag coefficient. The parameter $CL^{3/2}/CD$ is a measure of efficiency. The span size results in a wing area of 1.25 m². Using the following equation for lift $$L = W = \tfrac{1}{2} \times 1.225 \times v^2 \times S \times CL$$

where L=lift, W=aircraft take-off weight, density of air=1.225 Kg/m³ at 15° C., S=are of lifting surface, and the lift coefficient data in the figure, results in a take-off weight of 13.5 kg and a power consumption of 480 W.

The power system comprises two AXI 4120-20 brushless electrical motors. These are coupled to folding propellers, such as Graupner AEROCam 16"×8" (40 cm×20 cm) in diameter and pitch. Electronic speed control of the motors is provided by Castle Creations Phoenix ICE Lite 75 Electronic Speed Controllers (ESC). In this configuration each propeller delivers up to 5 kg in thrust. An optimum speed of horizontal flight is 76 km/h and a top speed of 97 km/h (at 15° C., 900 m altitude) is provided. This configuration permits vertical take-off and hover for weights up to 9 kg, allowing a safety margin. The use of folding propellers and electric motors is enough to overcome the vibration problems of the XF5U.

The unmanned UAV includes different payload options. The primary option is that the main camera 190 is a gyro stabilized video camera, such as the TASE LT from Cloud Cap Technologies. As discussed above, a tail landing camera 301 could be used in combination with an image processor (such as board 303 in FIG. 6) to perform pattern recognition of landing sites. This method would allow landing at sites without the need for GPS or other external signals.

The ailevators 130 and rudders 140 are built around torsion bars or spars 205 and 208 as shown in FIGS. 7a and 7b. These spars as well as being structural are also driven using a 4 servo arrangement: one for each rudder and ailevator, to provide full ailevator and rudder control. The servos used are Giant Scale Futaba 9XXX servos.

The unmanned air vehicle includes a housing for different hydrogen tank sizes. The housing is shown in FIGS. 5 and 10. The housing comprises a parallelepiped frame which couples to, or is part of, the airframe of the unmanned air vehicle. The hydrogen tank sits within a foam bed within the housing. Custom made foam beds can be used to adapt the housing to suit different sized fuel tanks without requiring adaption of the housing or airframe. The flexibility to use different sized fuel tanks allows payload vs fuel weights to be optimised such that for lighter payloads a smaller fuel tank is used because less fuel is expended for given mission. Alternatively a lighter payload may mean the air vehicle can carry more fuel and be able to travel further before returning to a base location.

Table 2 which follows summarizes the expected power consumption for different air vehicle weights. Endurance can be determined for different payload and filled fuel tank weights.

TABLE 2

Power consumption versus unmanned air vehicle weights.

| Weight W (Kg) | Lift L (N) | Drag D (N) | Cruise speed (km/h) | Stall speed (km/h) | Power P (Watts, elec, cruise) |
|---|---|---|---|---|---|
| 9.2 | 90 | 4.1 | 80 | 38.1 | 273 |
| 11.2 | 110 | 5.0 | 88.5 | 42.2 | 369 |
| 13.3 | 130 | 5.9 | 96.4 | 45.9 | 476 |

In table 2, the numbers in bold in the final row of the table correspond with the simulated values based on aerodynamic data as mentioned above. That is, the weight is approximately 13.5 kg and the power is approximately 480 W.

In the table the cruise condition has been assumed to be at lift/drag=22 which corresponds to the maximum value of CL/CD shown in FIG. 3. In the table the stall condition arises from the maximum vale of lift in FIG. 3, namely CL=0.97. Aerodynamic power consumption has been multiplied by a factor of three to account for aerodynamic losses so as to obtain the electrical power required for different take-off weights.

Various aspects could be varied to adjust the endurance of the vehicle. Two such aspects are: the size/weight of the hydrogen tank, and the payload configuration. Table 3 which follows sets out some different combinations.

TABLE 3

Total vehicle weights based on different fuel tank capacities and different payloads.

| Fuel Tank | | Payload weight (kg) | | |
|---|---|---|---|---|
| Weight (kg) | Volume (l) | TASE LT | EO + IR | LT + EO + IR |
| 1.4 | 2 | 9.2 | 8.9 | 9.4 |
| 3.2 | 5 | 11.0 | 10.7 | 11.2 |
| 4.2 | 6.8 | 11.5 | 11.7 | 12.2 |
| 5.2 | 9 | 13.0 | 12.7 | 13.2 |

In table 3 the first two columns relate to the fuel tank. The first column shows the weight of a fuel tank having a volume given in the second column. The third to fifth columns relate to total vehicle weight with various different payloads. The total weight includes the weight of the payload, the weight of the fuel tank and the weight of the rest of the vehicle. The payloads are as follows: TASE LT=TASE LT video camera; EO+IR=electro-optic and infra-red cameras; and LT+EO+IR=TASE LT video camera and electro-optic and infra-red cameras.

For the unmanned air vehicle described above with 9 kg of available thrust, vertical take-off and hover capability is limited to the 2 litre fuel tank because the vehicle weight does not exceed the thrust available. For the maximum weight without hover capability a nine litre fuel tank and all three payload options are available.

In an alternative arrangement a 5 litre fuel tank and the TASE LT video camera have a total weight of 10.5-11.0 kg, with an endurance of almost five hours. Other tank configurations provide the following endurances given in table 4.

TABLE 4

Endurance and take-off weight for various fuel tank volumes. Payload is TASE LT video camera.

| Tank volume (l) | Endurance (hours) | Take-off weight (kg) |
|---|---|---|
| 2 | 2.6 | 9.2 |
| 5 | 4.9 | 11.0 |
| 6.8 | 6.2 | 11.5 |
| 9 | 6.7 | 13.0 |

As shown in table 4, a 9 litre fuel tank is the maximum fuel tank size that can be used. Hover and vertical take-off cannot be achieved with such a large fuel tank.

The values in table 4 are based on a payload of the TASE LT video camera only with gyro-stabilisation. Alternatively, or additionally, high definition or infra-red cameras could be installed. Examples of these cameras are respectively the GoPro HERO HD camera which has a mass of 100 g, and the FLIR TAU infra-red camera which has a mass of 75 g. These two cameras could be used without a gimbal by flying the aircraft to direct the cameras at the target, such as the electrical cables or towers. In such an embodiment the aircraft would fly horizontally in the vicinity of the towers. The aircraft could be flown in the vicinity of the electrical towers and under the electrical cables with cameras pointing at least partly horizontally and/or upwards. With the HD and infra-red cameras looking at least partly forward or upward, they could also be used to scan the skies to look for other aircraft to provide a forward-looking sense and avoid system. Upon detection of an area requiring more detailed investigation, such as a hot spot, the vehicle can transition to hover mode with the body oriented vertically or pointing at least partly upward with the cameras or sensors also pointing upwards. A high definition and infra-red camera could be used in conjunction and could feed adapt to an image-processing board for onboard decision making, such as whether to continue taking more images of the hot-spot or whether to stop and continue along in horizontal flight.

We have considered various options in tables 3 and 4 taking into account payload and fuel tank weights. The unmanned air vehicle could be fitted with all three cameras (gimballed video camera such as TASE LT, fixed high definition camera, and infra-red camera) to have a take-off weight below 14 kg and still achieve an endurance of over 6 hours but with limited or no hover or high angle or attack capability.

It will be appreciated by those skilled in the art that only a small number of possible embodiments have been described and that many variations and modifications are possible without departing from the scope of the claimed invention.

The invention claimed is:

1. An unmanned aerial vehicle comprising:
    a body having a forward end and an aft end;
    a propeller that is located forward of the forward end;
    a first camera located adjacent to the forward end and configured for use during horizontal flight, the first camera having a maximum resolution;
    a second camera located adjacent to the aft end and configured to capture images having a downward view during hover flight, the second camera having a resolution that is greater than the maximum resolution of the first camera,
    wherein, in a horizontal flight mode, the body is adapted to provide lift as air flows across the body as the propeller provides horizontal thrust, and
    wherein, in a hover flight mode, the body is further adapted such that the unmanned aerial vehicle operates as a rotorcraft with the propeller providing vertical thrust for the unmanned aerial vehicle.

2. The unmanned aerial vehicle of claim 1, wherein during the horizontal flight mode the body is oriented more horizontally than vertically, and during the hover flight mode the body is oriented more vertically than horizontally.

3. A method of operating an unmanned aerial vehicle, the method comprising:
    flying the unmanned aerial vehicle of claim 2 in the horizontal flight mode;
    detecting a target zone by capturing a first image of the target zone using the first camera; and
    in response to detecting the target zone, transitioning the unmanned aerial vehicle from the horizontal flight mode to the hover flight mode.

4. The unmanned aerial vehicle of claim 1, wherein the body has a Zimmerman planform, an inverse Zimmerman planform, a square or rectangular planform, a circular or elliptical planform, or a trapezoidal planform symmetrical with respect to a longitudinal axis of the unmanned aerial vehicle.

5. A method of operating an unmanned aerial vehicle, the method comprising:
- flying the unmanned aerial vehicle of claim 4 in the horizontal flight mode;
- detecting a target zone by capturing a first image of the target zone using the first camera; and
- in response to detecting the target zone, transitioning the unmanned aerial vehicle from the horizontal flight mode to the hover flight mode.

6. The unmanned aerial vehicle of claim 1, wherein the body is a blended fuselage-wing all-lifting body.

7. A method of operating an unmanned aerial vehicle, the method comprising:
- flying the unmanned aerial vehicle of claim 6 in the horizontal flight mode;
- detecting a target zone by capturing a first image of the target zone using the first camera; and
- in response to detecting the target zone, transitioning the unmanned aerial vehicle from the horizontal flight mode to the hover flight mode.

8. The unmanned aerial vehicle of claim 1, wherein the propeller is mounted on a pod extending forward from the body.

9. A method of operating an unmanned aerial vehicle, the method comprising:
- flying the unmanned aerial vehicle of claim 8 in the horizontal flight mode;
- detecting a target zone by capturing a first image of the target zone using the first camera; and
- in response to detecting the target zone, transitioning the unmanned aerial vehicle from the horizontal flight mode to the hover flight mode.

10. The unmanned aerial vehicle of claim 1, wherein the propeller is a first propeller, the unmanned aerial vehicle further comprising a second propeller that is located forward of the body.

11. A method of operating an unmanned aerial vehicle, the method comprising:
- flying the unmanned aerial vehicle of claim 10 in the horizontal flight mode;
- detecting a target zone by capturing a first image of the target zone using the first camera; and
- in response to detecting the target zone, transitioning the unmanned aerial vehicle from the horizontal flight mode to the hover flight mode.

12. The unmanned aerial vehicle of claim 1, further comprising:
- an electric motor configured to drive the propeller;
- a fuel cell configured for generating electricity to power the electric motor; and
- an exhaust conduit for guiding exhaust of the fuel cell to blow across a flap of the body.

13. A method of operating an unmanned aerial vehicle, the method comprising:
- flying the unmanned aerial vehicle of claim 12 in the horizontal flight mode;
- detecting a target zone by capturing a first image of the target zone using the first camera; and
- in response to detecting the target zone, transitioning the unmanned aerial vehicle from the horizontal flight mode to the hover flight mode.

14. The unmanned aerial vehicle of claim 1, further comprising lower body skin skids configured for skid or belly landings.

15. A method of operating an unmanned aerial vehicle, the method comprising:
- flying the unmanned aerial vehicle of claim 14 in the horizontal flight mode;
- detecting a target zone by capturing a first image of the target zone using the first camera; and
- in response to detecting the target zone, transitioning the unmanned aerial vehicle from the horizontal flight mode to the hover flight mode.

16. A method of operating an unmanned aerial vehicle, the method comprising:
- flying the unmanned aerial vehicle of claim 1 in the horizontal flight mode;
- detecting a target zone by capturing a first image of the target zone using the first camera; and
- in response to detecting the target zone, transitioning the unmanned aerial vehicle from the horizontal flight mode to the hover flight mode.

17. The method of claim 16, further comprising capturing a second image of the target zone using the second camera.

18. The method of claim 17, wherein capturing the first image comprises capturing the first image while the unmanned aerial vehicle is in the horizontal flight mode, and wherein capturing the second image comprises capturing an image that has a higher resolution than the first image while the unmanned aerial vehicle is in the hover flight mode.

19. The method of claim 16, wherein the target zone includes a fault area of a power line.

* * * * *